(12) United States Patent
Sakakibara et al.

(10) Patent No.: US 8,715,901 B2
(45) Date of Patent: May 6, 2014

(54) RESIN COMPOSITION FOR FORMING FINE PATTERN AND METHOD FOR FORMING FINE PATTERN

(75) Inventors: Hirokazu Sakakibara, Tokyo (JP); Takayoshi Abe, Tokyo (JP); Takashi Chiba, Tokyo (JP); Toru Kimura, Tokyo (JP)

(73) Assignee: JSR Corporation, Tokyo (JP)

( * ) Notice: Subject to any disclaimer, the term of this patent is extended or adjusted under 35 U.S.C. 154(b) by 1071 days.

(21) Appl. No.: 11/597,332

(22) PCT Filed: May 24, 2005

(86) PCT No.: PCT/JP2005/009394
§ 371 (c)(1),
(2), (4) Date: Jul. 16, 2007

(87) PCT Pub. No.: WO2005/116776
PCT Pub. Date: Dec. 8, 2005

(65) Prior Publication Data
US 2007/0259287 A1    Nov. 8, 2007

(30) Foreign Application Priority Data

May 26, 2004 (JP) ................... 2004-156741
Dec. 3, 2004 (JP) ................... 2004-351295

(51) Int. Cl.
*G03F 7/00* (2006.01)
*G03F 7/004* (2006.01)
*G03F 7/028* (2006.01)
*G03F 7/40* (2006.01)

(52) U.S. Cl.
USPC ........ 430/270.1; 430/311; 430/300; 430/905; 430/927

(58) Field of Classification Search
USPC ............... 430/270.1, 311, 330, 905, 927
See application file for complete search history.

(56) References Cited

U.S. PATENT DOCUMENTS

| | | | | |
|---|---|---|---|---|
| 4,258,121 A | * | 3/1981 | Kojima | 430/281.1 |
| 4,318,766 A | | 3/1982 | Smith | |
| 4,442,196 A | * | 4/1984 | Iwaki et al. | 430/195 |
| 4,851,168 A | * | 7/1989 | Graiver et al. | 264/28 |
| 5,281,031 A | * | 1/1994 | Mottate | 384/47 |

(Continued)

FOREIGN PATENT DOCUMENTS

| | | |
|---|---|---|
| CN | 1309416 A | 8/2001 |
| CN | 1314931 | 9/2001 |

(Continued)

OTHER PUBLICATIONS

Machine translation of JP 2001-228616.*

(Continued)

*Primary Examiner* — Amanda C. Walke
(74) *Attorney, Agent, or Firm* — Ditthavong Mori & Steiner, P.C.

(57) ABSTRACT

A resin composition which, in forming a fine pattern by a heat treatment of a resist pattern formed by using a photoresist, can be applied onto the resist pattern, can cause the resist pattern to smoothly shrink by heat treatment, and can be easily washed away by a treatment with an alkaline aqueous solution, and a method for efficiently forming a fine resist pattern using the resin composition are provided. The resin composition comprises a resin containing a hydroxyl group, a crosslinking component, and an alcohol solvent containing water in an amount of 10 wt % or less for the total solvent, wherein the alcohol in the alcohol solvent is a monovalent alcohol having 1 to 8 carbon atoms.

17 Claims, 2 Drawing Sheets

(56) References Cited

U.S. PATENT DOCUMENTS

| | | | |
|---|---|---|---|
| 5,780,566 A * | 7/1998 | Mertesdorf | 526/262 |
| 5,863,701 A * | 1/1999 | Mertesdorf | 430/270.1 |
| 5,913,972 A * | 6/1999 | Kanou et al. | 106/31.87 |
| 6,005,137 A * | 12/1999 | Moore et al. | 560/139 |
| 6,025,449 A * | 2/2000 | Enomoto et al. | 526/320 |
| 6,074,802 A * | 6/2000 | Murata et al. | 430/270.1 |
| 6,555,607 B1 * | 4/2003 | Kanda et al. | 524/366 |
| 6,565,607 B1 * | 5/2003 | Cox | 715/205 |
| 6,838,229 B2 * | 1/2005 | Washio et al. | 430/324 |
| 6,908,724 B2 * | 6/2005 | Araki et al. | 430/270.1 |
| 7,014,980 B2 * | 3/2006 | Allen et al. | 430/270.1 |
| 7,338,750 B2 * | 3/2008 | Kozawa et al. | 430/314 |
| 7,419,769 B2 * | 9/2008 | Saito et al. | 430/315 |
| 2002/0000536 A1 * | 1/2002 | Spitz et al. | 252/182.13 |
| 2003/0078352 A1 * | 4/2003 | Miyazawa et al. | 526/245 |
| 2003/0175624 A1 | 9/2003 | Nozaki et al. | |
| 2007/0190465 A1 * | 8/2007 | Nishikawa et al. | 430/313 |

FOREIGN PATENT DOCUMENTS

| | | |
|---|---|---|
| EP | 1152036 A1 | 11/2001 |
| JP | 01-307228 A | 12/1989 |
| JP | 04-364021 A | 12/1992 |
| JP | 06-250379 A | 9/1994 |
| JP | 07-045510 A | 2/1995 |
| JP | 2723260 B | 11/1997 |
| JP | 10-73927 A | 3/1998 |
| JP | 11-283910 | 10/1999 |
| JP | 2001-19860 A | 1/2001 |
| JP | 2001-228616 | 8/2001 |
| JP | 2003-131400 A | 5/2003 |
| JP | 2003-195527 A | 7/2003 |
| JP | 2003-215814 | 7/2003 |
| TW | 466583 B | 12/2001 |
| WO | WO 01/00735 A1 | 1/2001 |
| WO | WO 03/014830 A1 | 2/2003 |

OTHER PUBLICATIONS

Japanese Office Action for corresponding JP Application No. 2006-513875, Sep. 14, 2010.

Supplementary European Search Report for corresponding EP Application No. 05743737.8-2222, Mar. 29, 2011.

Korean Office Action for corresponding KR Application No. 10-2006-7027090, Oct. 24, 2011.

* cited by examiner

RESIN COMPOSITION FOR FORMING FINE PATTERN AND METHOD FOR FORMING FINE PATTERN

TECHNICAL FIELD

The present invention relates to a microfabrication technology using a photoresist and, in particular, to a resin composition for forming fine patterns used for causing patterns formed by patterning to shrink by a heat treatment and to a method for forming fine patterns. More specifically, the invention relates to a resin composition for forming fine patterns and to a method for forming fine patterns which, owing to increased wettability for photoresist patterns due to the use of an alcoholic solvent, can easily cover patterns with a diameter of 100 nm or less with a coating without incorporating bubbles therein and, when applying the resin composition for forming fine patterns, can be applied using the cup or waste-water-processing facility used for applying the underlayer coating or photoresist without newly introducing an aqueous-type coating cup or a waste-water-processing facility.

BACKGROUND ART

In recent years, a lithography process for manufacturing semiconductors demands a higher degree of miniaturization according to the progress of downsizing of semiconductor devices. Specifically, since microfabrication of 100 nm or less is now demanded in a lithographic process, various methods for forming fine patterns using a photoresist material responding to irradiation with rays with a short wavelength such as an ArF excimer laser, $F_2$ excimer laser, and the like have been studied.

In such a lithography technology, because a limitation to the degree of miniaturization is unavoidable due to the restriction of wavelength of rays to which the photoresist material is exposed, researches to enable formation of detailed patterns which surpass the wavelength limit have been undertaken heretofore. Specifically, a method for miniaturizing resist patterns by a process comprising patterning a resist for electron beams such as polymethyl methacrylate, applying a positive-tone resist onto the resist pattern, treating the positive-tone resist with heat to form a reaction layer on the boundary of the resist pattern and the positive resist layer, and removing the unreacted part of the positive-tone resist (Patent Document 1), a method of forming a reaction layer between a lower layer resist pattern and an upper layer resist using heat crosslinking with an acid generator or an acid (Patent Document 2), a method for manufacturing a semiconductor device using a fine pattern-forming material comprising a water soluble resin, a water-soluble crosslinking agent, or a mixture of these dissolved in an aqueous solvent, but not containing a photosensitive component, as a solution for applying an upper layer resist (Patent Document 3), a method comprising forming a photosensitive layer of a chemically-amplified resist on a substrate, irradiating to form an image and developing to form a resist pattern, applying a coating film-forming agent comprising a water soluble resin such as polyvinyl acetal, a water-soluble crosslinking agent such as tetra(hydroxymethyl)glycoluril, a water-soluble nitrogen-containing organic compound such as amine, and, optionally, a surfactant containing fluorine and silicon to the resist pattern, heating the resultant coating film to form a water-insoluble reaction layer on the interface of the resist pattern and the coating film for miniaturizing the resist pattern, and removing the unreacted area of the coating film for miniaturizing the resist pattern with pure water (Patent Document 4), and the like have been proposed.

Although these methods are preferable due to their capability of miniaturizing patterns surpassing the wavelength limit of a photosensitive resist (under layer resist) in a simple manner by using a fine pattern-forming material (upper layer resist), they have problems such as crosslinking of the fine pattern-forming material in unnecessary areas in the bottom of the resist pattern, a skirt-like configuration, inadequate verticality of the cross-sectional configuration of the fine pattern-forming material, or an effect of mixing bake (heating causing crosslinking) on the upper layer resist pattern size and the pattern profile. Moreover, since these processes have a high heat dependency of about 10 to 20 nm/° C., and it is difficult to maintain a uniform temperature in a wafer plane during enlargement of a substrate or miniaturization of patterns, there is another problem of poor pattern-size-controlling-performance. Furthermore, a fine pattern-forming material using the above-mentioned water-soluble resin has a problem of low resistance to dry etching due to a limitation of water solubility. Low dry etching resistance leads to a problem of inaccurate transcription of a resist pattern to a substrate when a pattern is transferred to the substrate by dry etching using the resist pattern as a mask in fabricating a semiconductor device.

In addition, a heat flow process which comprises forming a photoresist pattern on a substrate, heating or radiating the pattern to fluidize the photoresist pattern, and reducing the pattern size to a size smaller than the resolution limit has been proposed (Patent Documents 5 and 6).

However, because controlling fluidity of a resist by heat or radiation is difficult in this process, it is difficult to obtain products with a constant quality. In another process developed based on the heat flow process, the fluidity of a photoresist is controlled by providing a water-soluble resin film on the substrate after forming the resist pattern (Patent Document 7). However, because the solubility and stability over time of the water-soluble resin such as polyvinyl alcohol used in this process are insufficient for removing the resin with water, a residue remains after washing with water.

In order to form a fine resist pattern by heat shrinkage of the resist pattern formed by using a photoresist, a coating agent for miniaturizing a resist pattern that can be removable by washing with water after heat shrinking of the resist pattern on which upper layer coat-forming agent is previously provided and a method for efficiently forming a fine resist pattern using that agent have been proposed (Patent Document 8). In this method, the coating agent for miniaturizing a resist pattern is an aqueous-type agent and can only insufficiently cover fine resist patterns such as contact holes with a diameter of 100 nm or less. In addition, a cup required for exclusively applying the aqueous-type agent results in a cost increase. Moreover, the coating agent has a problem of freezing or depositing at a low temperature during transportation and the like.

(Patent Document 1) Japanese Patent No. 2723260
(Patent Document 2) JP-A-6-250379
(Patent Document 3) JP-A-10-73927
(Patent Document 4) JP-A-2001-19860
(Patent Document 5) JP-A-1-307228
(Patent Document 6) JP-A-4-364021
(Patent Document 7) JP-A-7-45510
(Patent document 8) JP-A-2003-195527

DISCLOSURE OF THE INVENTION

Problems to be Solved by the Invention

The present invention has been completed in order to solve the above problems. An object of the present invention is to provide a resin composition which, in forming a fine pattern by a heat treatment of a resist pattern formed by using a photoresist, can be applied onto the resist pattern, can cause the resist pattern to smoothly shrink by heat treatment, and can be easily washed away by a treatment with an alkaline aqueous solution, and a method for efficiently forming a fine resist pattern using the resin composition.

Means for Solving the Problems

The resin composition for forming fine patterns of the present invention comprises a resin containing a hydroxyl group, a crosslinking component, and a solvent and can miniaturize patterns formed by a resist material, wherein the solvent dissolves the resin and the crosslinking component, but cannot dissolve the resist material. In particular, the solvent includes an alcohol and the alcohol is a monovalent alcohol having 1 to 8 carbon atoms. In addition, the solvent including the alcohol contains not more than 10 wt % of water.

The hydroxyl group (—OH) contained in the resin is at least one hydroxyl group selected from hydroxyl groups originating from an alcohol, a phenol, or a carboxylic acid.

The crosslinking component comprises at least one compound selected from the group consisting of a compound having the group shown by the following formula (1) and a compound containing two or more cyclic ether as reactive groups, (1)

wherein $R^1$ and $R^2$ individually represent a hydrogen atom or a group shown by the following formula (2), provided that at least one of $R^1$ and $R^2$ is the group shown by the following formula (2), (2)

wherein $R^3$ and $R^4$ individually represent a hydrogen atom, an alkyl group having 1 to 6 carbon atoms, or an alkoxyalkyl group having 1 to 6 carbon atoms, or $R^3$ and $R^4$ bond together to form a ring having 2 to 10 carbon atoms, and $R^5$ represents a hydrogen atom or an alkyl group having 1 to 6 carbon atoms.

The method for forming a fine pattern of the present invention comprises a step of forming a resist pattern on a substrate, a step of forming a coating of the resin composition for forming fine patterns of the present invention on the resist pattern, a step of treating the coated substrate with heat, and a step of removing the coating with an alkaline aqueous solution and washing the substrate with water.

Effects of the Invention

The resin composition for forming fine patterns of the present invention excels in applicability to fine resist patterns and controllability of the size of cured film due to inclusion of a hydroxyl group-containing resin, a crosslinking component, and a solvent that can dissolve the resin and the crosslinking component, but cannot dissolve the resist material. For this reason, the resist pattern space can be effectually and accurately miniaturized and patterns surpassing the wavelength limit can be economically formed at a low cost with minimal pattern defects regardless of the state of a substrate surface.

The resin used in the composition for forming fine patterns of the present invention exhibits a large shrinkage, only a low temperature dependency during shrinkage, excellent shape retainability after shrinkage, and low pitch dependability. Therefore, the resin composition has a wide process window (or an exposure depth-window) which is a pattern-forming margin to process fluctuation. Moreover, the composition excels in etching resistance.

Furthermore, if the fine resist pattern formed in this manner is used as a mask for dry etching, trench patterns and holes can be formed with sufficient accuracy on a semiconductor substrate, and semiconductor devices and the like with fine trench patterns and holes can be easily manufactured in a sufficient yield.

BEST MODE FOR CARRYING OUT THE INVENTION

As a result of extensive studies on a resin composition of which the resist pattern can be smoothly caused to shrink by a treatment with heat and easily removed by a subsequent treatment with an alkaline aqueous solution, the present inventors have found that fine patterns can be efficiently formed by using a resin composition comprising a specific resin which is not soluble in water, but soluble in alcohol, a crosslinking component, and an alcoholic solvent. This finding has led to the completion of the present invention.

The resin composition for forming fine patterns of the present invention is a resin solution containing a resin containing a hydroxyl group and a crosslinking component in an alcoholic solvent. The resin containing a hydroxyl group may be any resin containing a structural unit which has at lest one hydroxyl group (—OH) selected from hydroxyl groups originating from an alcohol, a phenol, or a carboxylic acid. As such a resin, a (meth)acrylic resin, a vinyl resin (the (meth)acrylic resin and vinyl resin are hereinafter referred to as "Copolymer I"), a novolak resin, or a mixture of these resins can be used.

The resin composition for forming fine patterns exhibiting excellent etching resistance can be obtained by using the alcohol-soluble resin containing a hydroxyl group.

Copolymer I can be obtained by copolymerizing monomers having at least one hydroxyl group selected from an alcoholic hydroxyl group, a hydroxyl group originating from a carboxylic acid, and a phenolic hydroxyl group.

As examples of the monomer containing an alcoholic hydroxyl group, hydroxyalkyl(meth)acrylates such as 2-hydroxyethyl acrylate, 2-hydroxyethyl methacrylate, 2-hydroxypropyl acrylate, 2-hydroxypropyl methacrylate, 4-hydroxybutyl acrylate, 4-hydroxybutyl methacrylate, glycerol monomethacrylate, and the like can be given. Of these, preferable monomers are 2-hydroxyethyl acrylate and 2-hydroxyethyl methacrylate. These monomers may be used either individually or in combination of two or more.

Monomers having a fluoroalkyl group at the α-position shown by the following formula (3) can also be used as a hydroxyl group-containing monomer, (3)

wherein $R^6$ represents a hydrogen atom or a methyl group. $R^7$ represents a linear or cyclic divalent hydrocarbon group.

As examples of $R^7$, saturated linear hydrocarbon groups such as a methylene group, ethylene group, propylene group (1,3-propylene group, 1,2-propylene group), tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, icosa methylene group, 1-methyl-1,3-propylene group, 2-methyl-1,3-propylene group, 2-methyl-1,2-propylene group, 1-methyl-1,4-butylene group, 2-methyl-1,4-butylene group, ethylidene group, propylidene group, and 2-propylidene group; monocyclic hydrocarbon groups such as cycloalkylene groups having 3 to 10 carbon atoms such as cyclobutylene groups (e.g. a 1,3-cyclobutylene group), cyclopentylene groups (e.g. a 1,3-cyclopentylene group), cyclohexylene groups (e.g. a 1,4-cyclohexylene group), and cyclooctylene groups (e.g. a 1,5-cyclooctylene group); bridged cyclic hydrocarbon groups such as cyclic hydrocarbon groups with a 2 to 4 rings having 4 to 30 carbon atoms such as a norbornylene groups (e.g. 1,4-norbornylene group, 2,5-norbornylene group), and admantylene groups (e.g. 1,5-admantylene group, 2,6-admantylene group); and the like can be given.

It is preferable to insert an alkylene group having 1 to 4 carbon atoms as a spacer between a bis(trifluoromethyl)hydroxymethyl group and $R^7$, particularly when the $R^7$ is an alicyclic hydrocarbon group.

Of the above, monomers having a 2,5-norbornylene group or 1,2-propylene group as $R^7$ in the formula (3) are preferable.

As a preferable monomer represented by the formula (3), 4,4,4-trifluoro-3-hydroxy-1-methyl-3-trifluoromethyl-1-butyl methacrylate can be given. The proportion of these monomers in the total monomers forming the copolymer is usually 5 to 90 mol %, and preferably 10 to 60 mol %.

As examples of the monomers containing a hydroxyl group originating from an organic acid such as a carboxylic acid, monocarboxylic acids such as acrylic acid, methacrylic acid, crotonic acid, 2-succinoloylethyl(meth)acrylate, 2-maleinoloylethyl(meth)acrylate, 2-hexahydrophthaloylethyl (meth)acrylate, ω-carboxypolycaprolactone monoacrylate, monohydroxyethyl phthalate acrylate, acrylic acid dimer, 2-hydroxy-3-phenoxypropyl acrylate, t-butoxy methacrylate, and t-butyl acrylate; (meth)acrylic acid derivatives having a carboxyl group such as dicarboxylic acid such as maleic acid, fumaric acid, citraconic acid, mesaconic acid, or itaconic acid; and the like can be given. These compounds may be used either individually or in combination of two or more. As examples of commercially available products of ω-carboxypolycaprolactone monoacrylate, acrylic dimmer, and 2-hydroxy-3-phenoxypropyl acrylate, "Aronix M-5300", "Aronix M-5600", and "Aronix M-5700", all manufactured by Toagosei Co., Ltd. can be respectively given.

Of these, acrylic acid, methacrylic acid, and 2-hexahydrophthaloylethyl methacrylate are preferable. The proportion of these monomers in the total monomers forming the copolymer is usually 5 to 90 mol %, and preferably 10 to 60 mol %.

As examples of the monomer containing a phenolic hydroxyl group, p-hydroxystyrene, m-hydroxystyrene, o-hydroxystyrene, α-methyl-p-hydroxystyrene, α-methyl-m-hydroxystyrene, α-methyl-o-hydroxystyrene, 2-allylphenol, 4-allylphenol, 2-allyl-6-methylphenol, 2-allyl-6-methoxyphenol, 4-allyl-2-methoxyphenol, 4-allyl-2,6-dimethoxyphenol, 4-allyloxy-2-hydroxybenzophenone, and the like can be given. Of these, p-hydroxystyrene or α-methyl-p-hydroxystyrene is preferable.

As a monomer having a phenolic hydroxyl group, a monomer having an amide group in the molecule shown by the following formula (4) can be given, (4)

wherein $R^8$ and $R^{10}$ represent a hydrogen atom or methyl group and $R^9$ is the same as $R^7$ in the formula (3). As the monomer shown by the formula (4), p-hydroxymethacrylanilide is preferable. The proportion of the monomers having a phenolic hydroxyl group shown by the formula (4) in the total monomers forming the copolymer is usually 30 to 95 mol %, and preferably 40 to 90 mol %.

A monomer having a functional group convertible into a phenolic hydroxyl group after copolymerization can also be copolymerized. As examples of such a monomer, p-acetoxystyrene, α-methyl-p-acetoxystyrene, p-benzyloxystyrene, p-tert-butoxystyrene, p-tert-butoxycarbonyloxystyrene, p-tert-butyldimethylsiloxystyrene, and the like can be given. When these compounds having the functional group are used, the functional group can be easily converted into a phenolic hydroxyl group by a suitable treatment, for example, hydrolysis using hydrochloric acid or the like. The proportion of the monomers having the functional group before and after conversion into the phenolic hydroxyl group in the total monomers forming the copolymer is usually 5 to 90 mol %, and preferably 10 to 80 mol %.

The proportions of the monomers having an alcoholic hydroxyl group, a hydroxyl group originating from carboxylic acid, or a phenolic hydroxyl group in the total monomers forming the copolymer I are respectively in the above-described ranges. If the amount of the structural unit having a hydroxyl group is too small, the number of the sites reactive with the later-described crosslinking component is insufficient for the resist material to cause pattern shrinkage. If the amount is too great, on the other hand, the resist material may swell during development and fill out the patterns.

In the case of the monomer having a phenolic hydroxyl group and the monomer having an alcoholic hydroxyl group, for example, the copolymer may consist only of structural units having hydroxyl groups.

In producing the copolymer I, other monomers may be copolymerized in order to control hydrophilicity and solubility of the resin. The other monomers herein indicate monomers other than the above-described monomers having at least one hydroxyl group selected from an alcoholic hydroxyl group, a hydroxyl group originating from an organic acid such as a carboxylic acid, and a phenolic hydroxyl group. As examples of such other monomers, (meth)acrylic acid aryl esters, dicarboxylic acid diesters, nitrile group-containing polymerizable compounds, amide bond-containing polymerizable compounds, vinyl compounds, allyl compounds, chlorine-containing polymerizable compounds, conjugated diolefins, and the like can be given. Specific examples include dicarboxylic acid diesters such as diethyl maleate, diethyl fumarate, and diethyl itaconate; (meth)acrylic acid aryl esters such as phenyl(meth)acrylate and benzyl(meth)acrylate; aromatic vinyl compounds such as styrene, α-methylstyrene, m-methylstyrene, p-methylstyrene, vinyltoluene, p-methoxystyrene, and p-t-butoxystyrene; (meth)acrylates such as t-butyl(meth)acrylate and 4,4,4-trifluoro-3-hydroxy-1-methyl-3-trifluoromethyl-1-butyl(meth)acrylate; nitrile group-containing polymerizable compounds such as acrylonitrile and methacrylonitrile; amide bond-containing polymerizable compounds such as acrylamide and methacrylamide; fatty-acid vinyl compounds such as vinyl acetate; chlorine-containing polymerizable compounds such as vinyl chloride and vinylidene chloride; conjugated diolefins such as 1,3-butadiene, isoprene, and 1,4-dimethylbutadiene; and the like can be given. These monomers may be used either individually or in combination of two or more.

The copolymer I is prepared by, for example, polymerizing the monomers corresponding to each of the above recurring units in an appropriate solvent in the presence of a chain transfer agent, as required, using a radical polymerization initiator such as hydroperoxides, dialkyl peroxides, diacyl peroxides, or azo compounds.

As examples of the solvent which can be used for the polymerization, alkanes such as n-pentane, n-hexane, n-heptane, n-octane, n-nonane, and n-decane; cycloalkanes such as cyclohexane, cycloheptane, cyclooctane, decalin, and norbornane; aromatic hydrocarbons such as benzene, toluene, xylene, ethylbenzene, and cumene; halogenated hydrocarbons such as chlorobutanes, bromohexanes, dichloroethanes, hexamethylene dibromide, and chlorobenzene; saturated carboxylic acid esters such as ethyl acetate, n-butyl acetate, i-butyl acetate, methyl propionate, and propylene glycol monomethyl ether acetate; alkyllactones such as γ-butyrolactone; ethers such as tetrahydrofuran, dimethoxyethanes, and diethoxyethanes; alkylketones such as 2-butanone, 2-heptanone, and methyl isobutyl ketone; cycloalkylketones such as cyclohexanone; alcohols such as 2-propanol, 1-butanol, 4-methyl-2-pentanol, and propylene glycol monomethyl ether; and the like can be given. These solvents may be used either individually or in combinations of two or more.

The polymerization temperature is usually from 40 to 120° C., and preferably from 50 to 100° C. The reaction time is usually from 1 to 48 hours, and preferably from 1 to 24 hours.

It is preferable that the copolymer I have a high purity. Not only is the content of impurities such as halogens or metals preferably small, but also the content of resisual monomers and oligomers is preferably less than the prescribed amount, for example, the content determined by HPLC is preferably 0.1 wt % or less. The copolymer I with a high purity ensures further improvement of process stability, pattern profile, and the like of the resin composition for forming fine patterns of the present invention containing copolymer I and provides a resin composition for forming fine patterns of which the content of foreign matter in a solution and the sensitivity do not change over time.

As examples of a purification method for the copolymer I obtained in the above method, the following methods can be given. As a method for removing impurities such as metals, a method of causing metals in the polymer solution to be adsorbed using a zeta-potential filter, a method of causing metals to be in a chelate state by washing the polymer solution with an acidic aqueous solution such as oxalic acid or sulfonic acid aqueous solution and removing the metals, and the like can be given. As a method for removing the residual monomers and oligomer components to reduce their content to a concentration not more than a specific value, a liquid-liquid extraction method in which the residual monomers and oligomer components are removed by washing with water or a combination of suitable solvents, a purification method in a solution state such as ultrafiltration in which only the monomers and oligomer components having a specific molecular weight or less are extracted and removed, a reprecipitation method in which the residual monomers and the like are removed by adding the polymer solution to a poor solvent dropwise, thereby causing the polymer to coagulate in the poor solvent, a purification method in a solid state in which the resin slurry separated by filtration is washed with a poor solvent, and the like can be given. These methods may be used in combination.

The polystyrene-reduced weight average molecular weight Mw of the copolymer I determined by gel permeation chromatography is usually 1,000 to 500,000, preferably 1,000 to 50,000, and particularly preferably 1,000 to 20,000. If the molecular weight is too great, the copolymer may not be removed by a developer after curing with heat; if too small, a uniform coating film may not be formed after application.

The novolak resin used in the present invention is preferably soluble in alkali. Such a novolak resin can be obtained by, for example, addition condensation of an aromatic compound having a phenolic hydroxyl group (hereinafter referred to as "phenols") and an aldehyde in the presence of an acid catalyst. Examples of the phenols used in the addition condensation include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethylphenol, 3,4,5-trimethylphenol, p-phenylphenol, resorcinol, hydroquinone, hydroquinone monomethyl ether, pyrogallol, fluoroglycinol, hydroxydiphenyl, bisphenol A, gallic acid, gallic acid ester, α-naphthol, β-naphthol, and the like. The aldehydes include, for example, formaldehyde, paraformaldehyde, furfural, benzaldehyde, nitrobenzaldehyde, acetaldehyde, and the like. There are no specific limitations to the catalyst for the addition condensation reaction. For example, hydrochloric acid, nitric acid, sulfuric acid, formic acid, oxalic acid, acetic acid, and the like can be used as the acid catalyst. Although the weight average molecular weight of the novolac resin is not specifically limited, a preferable range is from 1,000 to 30,000.

The crosslinking component used in the present invention is a compound having the group shown by the following formula (1) (hereinafter referred to as "crosslinking component I") and a compound containing two or more cyclic ethers as reactive groups (hereinafter referred to as "crosslinking component II"). When the crosslinking component I and crosslinking component II can be mixed, crosslinking component may be a mixture of the two.

(1)

wherein $R^1$ and $R^2$ individually represent a hydrogen atom or a group shown by the following formula (2), provided that at least one of $R^1$ and $R^2$ is the group shown by the following formula (2), (2)

wherein $R^3$ and $R^4$ individually represent a hydrogen atom, an alkyl group having 1 to 6 carbon atoms, or an alkoxyalkyl group having 1 to 6 carbon atoms, or $R^3$ and $R^4$ bond together to form a ring having 2 to 10 carbon atoms, and $R^5$ represents a hydrogen atom or an alkyl group having 1 to 6 carbon atoms.

The above-mentioned crosslinking components act as a crosslinking component (curing component) with which the resin containing a hydroxyl group mentioned above reacts and/or the crosslinking components mutually reacts with the action of an acid.

The compound (crosslinking component 1) shown by the formula (1) is a compound having an imino group, a methylol group, a methoxymethyl group, or the like as a functional group in the molecule, and includes, for example, nitrogen-containing compounds prepared by alkyl-ethrification of all or a part of active methylol group of a compound such as (poly)methylolized melamine, (poly)methylolized glycoluril, (poly)methylolized benzoquanamine, (poly)methylolized urea, and the like. As examples of the alkyl group, a methyl group, ethyl group, butyl group, or a mixture of these groups can be given, and may partly include an oligomer component which is made by condensation. As specific examples, hexamethoxymethylated melamine, hexabutoxymethylated melamine, tetramethoxymethylated glycoluril, tetrabutoxymethylated glycoluril, and the like can be given.

As commercially available compounds, Cymel 300, Cymel 301, Cymel 303, Cymel 350, Cymel 232, Cymel 235, Cymel 236, Cymel 238, Cymel 266, Cymel 267, Cymel 285, Cymel 1123, Cymel 1123-10, Cymel 1170, Cymel 370, Cymel 771, Cymel 272, Cymel 1172, Cymel 325, Cymel 327, Cymel 703, Cymel 712, Cymel 254, Cymel 253, Cymel 212, Cymel 1128, Cymel 701, Cymel 202, and Cymel 207 (manufactured by Nihon Cytec Industries, Inc.), Nikalac MW-30M, Nikalac MW-30, Nikalac MW-22, Nikalac MW-24X, Nikalac MS-21, Nikalac MS-11, Nikalac MS-001, Nikalac MX-002, Nikalac MX-730, Nikalac MX-750, Nikalac MX-708, Nikalac MX-706, Nikalac MX-042, Nikalac MX-035, Nikalac MX-45, Nikalac MX-410, Nikalac MX-302, Nikalac MX-202, Nikalac SM-651, Nikalac SM-652, Nikalac SM-653, Nikalac SM-551, Nikalac SM-451, Nikalac SB-401, Nikalac SB-355, Nikalac SB-303, Nikalac SB-301, Nikalac SB-255, Nikalac SB-203, Nikalac SB-201, Nikalac BX-4000, Nikalac BX-37, Nikalac BX-55H, and Nikalac BL-60 (manufactured by Sanwa Chemical Co., Ltd.), and the like can be given. Cymel 325, Cymel 327, Cymel 703, Cymel 712, Cymel 254, Cymel 253, Cymel 212, Cymel 1128, Cymel 701, Cymel 202, and Cymel 207 which are the compounds of the formula (1) in which either $R^1$ or $R^2$ is a hydrogen atom, that is, crosslinking components having an imino group, are preferable.

The compound containing two or more cyclic ethers as reactive groups (crosslinking component II) includes, for example, epoxycyclohexyl group-containing compounds such as 3,4-epoxycyclohexylmethyl-3',4'-epoxycyclohexane carboxylate, 2-(3,4-epoxycyclohexyl-5,5-spiro-3,4-epoxy)cyclohexane meta-dioxane, bis(3,4-epoxycyclohexylmethyl)adipate, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), di(3,4-epoxycyclohexylmethyl)ether of ethylene glycol, ethylenebis(3,4-epoxycyclohexane carboxylate), ε-caprolactone-modified 3,4-epoxycyclohexylmethyl-3',4'-epoxycyclohexane carboxylate, trimethylcaprolactone-modified 3,4-epoxycyclohexylmethyl-3',4'-epoxycyclohexane carboxylate, and β-methyl-δ-valerolactone-modified 3,4-epoxycyclohexylmethyl-3',4'-epoxycyclohexane carboxylate; bisphenol A diglycidyl ether, bisphenol F diglycidyl ether, bisphenol S diglycidyl ether, chlorinated bisphenol A diglycidyl ether, chlorinated bisphenol F diglycidyl ether, chlorinated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerol triglycidyl ether, trimethylolpropane triglycidyl ether, polyethylene glycol diglycidyl ether, polypropylene glycol diglycidyl ether; polydiglycidyl ethers of polyether polyol obtained by adding one or more alkylene oxide to an aliphatic polyhydric alcohol such as ethylene glycol, propylene glycol, or glycerol; diglycidyl esters of an aliphatic long-chain dibasic acid; monoglycidyl ethers of an aliphatic higher alcohol; monodiglycidyl ethers of phenol, cresol, or butyl phenol, or a polyether alcohol obtained by adding an alkylene oxide to the phenol, cresol, or butyl phenol; glycidyl esters of a higher fatty acid; oxetane compounds having two or more oxetane rings in the molecule such as 3,7-bis(3-oxetanyl)-5-oxanonane, 3,3'-(1,3-(2-methylenyl)propanediylbis(oxymethylene))bis-(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl)ether, dicyclopentenyl bis(3-ethyl-3-oxetanylmethyl)ether, triethylene glycol bis(3-ethyl-3-oxetanylmethyl)ether, tetraethylene glycol bis(3-ethyl-3-oxetanylmethyl)ether, tricyclodecanediyldimethylene (3-ethyl-3-oxetanylmethyl)ether, trimethylolpropane tris(3-ethyl-3-oxetanylmethyl)ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl)ether, pentaerythritol tetrakis(3-ethyl-3-oxetanylmethyl)ether, polyethylene glycol bis(3-ethyl-3-oxetanylmethyl)ether, dipentaerythritol hexakis(3-ethyl-3-oxetanylmethyl)ether, dipentaerythritol pentakis(3-ethyl-3-oxetanylmethyl)ether, dipentaerythritol tetrakis(3-ethyl-3-oxetanyl methyl)ether, caprolactone-modified dipentaerythritol hexakis(3-ethyl-3-oxetanylmethyl)ether, caprolactone-modified dipentaerythritol pentakis(3-ethyl-3-oxetanylmethyl)ether, a ditrimethylolpropane tetrakis(3-ethyl-3-oxetanylmethyl)ether, ethylene oxide (EO)-modified bisphenol A bis(3-ethyl-3-oxetanylmethyl)ether, propylene oxide (PO)-modified bisphenol A bis (3-ethyl-3-oxetanylmethyl)ether, EO-modified hydrogenated bisphenol A bis(3-ethyl-3-oxetanylmethyl)ether, PO-modified hydrogenated bisphenol A bis(3-ethyl-3-oxetanylmethyl)ether, EO-modified bisphenol F (3-ethyl-3-oxetanylmethyl)ether, and the like.

Of these, 1,6-hexanediol diglycidyl ether and dipentaerythritol hexakis(3-ethyl-3-oxetanylmethyl)ether are preferable as the crosslinking component II.

The above compounds may be used either individually or in combinations of two or more as the crosslinking component II.

The amount of the crosslinking components to be added is 1 to 100 parts by weight, and preferably 5 to 70 parts by weight for 100 parts by weight of the resin having a hydroxyl group. If the amount is less than 1 part by weight, the resin composition cures only inadequately and may not cause pattern shrinkage; if more than 100 parts by weight, there is a possibility that patterns are buried due to excessive curing.

The total amount of the resin having a hydroxyl group and crosslinking component in the resin composition including the later-described alcoholic solvent is 0.1 to 30 wt %, and preferably 1 to 20 wt %. If the amount of the resin having a hydroxyl group and the crosslinking component is less than 0.1 wt %, the thickness of the coating film is so small that the film may be cut at etched points of the patterns; if more than 30 wt %, the viscosity is too high for the resin to fill out fine patterns.

Any alcoholic solvents that can sufficiently dissolve the resin having a hydroxyl group and the crosslinking component, but cannot dissolve a photoresist film during application to the photoresist film and does not cause intermixing with the photoresist film can be used in the present invention.

In the present invention, "dissolve the resin having a hydroxyl group and the crosslinking component" refers to the properties of a solvent of being a transparent liquid when a solution in which 10 wt % of the resin having a hydroxyl group and the crosslinking component are dissolved (at 25° C. for one hour) is inspected by naked eye observation, and "not dissolve a photoresist film" refers to the properties of a solvent of retaining the photoresist film without changing its shape when 10 wt % of the photoresist film is dipped in the solvent (at 25° C. for one hour) as inspected by naked eye observation.

A monohydric alcohol having 1 to 8 carbon atoms is preferable as such a solvent. As examples of such a solvent, 1-propanol, isopropanol, 1-butanol, 2-butanol, tert-butanol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, 2-methyl-3-heptanol, and the like can be given. Of these, 1-butanol, 2-butanol, and 4-methyl-2-pentanol are preferable. These alcoholic solvents may be used either individually or in combinations of two or more.

The alcoholic solvents may contain water in an amount of 10 wt % or less, and preferably 1 wt % or less of the total amount of solvents used. If more than 10 wt %, the solubility of the resin having a hydroxyl group decreases. An absolute alcohol solvent which does not contain water is more preferable.

When applying the resin composition for forming fine patterns of the present invention to a photoresist film, another solvent may be mixed in order to adjust applicability. The other solvents allow the resin composition for forming fine patterns to be evenly applied to the photoresist film without eroding the photoresist film.

As examples of the other solvents, cyclic ethers such as tetrahydrofuran and dioxane; alkyl ethers of polyhydric alcohol such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether; alkyl ether acetates of polyhydric alcohol such as ethylene glycol ethyl ether acetate, diethylene glycol ethyl ether acetate, propylene glycol ethyl ether acetate, and propylene glycol monomethyl ether acetate; aromatic hydrocarbons such as toluene and xylene; ketones such as acetone, methyl ethyl ketone, methyl isobutyl ketone, cyclohexanone, 4-hydroxy-4-methyl-2-pentanone, and diacetone alcohol; esters such as ethyl acetate, butyl acetate, ethyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, ethyl acetate, and butyl acetate; and water can be given. Of these, cyclic ethers, alkyl ether of polyhydric alcohol, alkyl ether acetates of polyhydric alcohol, ketones, esters, and water are preferable.

The amount of the other solvents is 30 wt % or less, and preferably 20 wt % or less of the total amount of the solvents. If more than 30 wt %, the solvent causes problems such as erosion of a photoresist film, intermixing with the resin composition for forming fine patterns, and the like. As a result, the resin composition may fill out the resist patterns. When water is mixed, the amount is not more than 10 wt %.

A surfactant can be blended with the resin composition for forming fine patterns of the present invention in order to increase applicability, defoamability, leveling properties, and the like.

As the surfactant, commercially available fluorine-containing surfactants such as BM-1000, BM-1100 (manufactured by BM Chemie), Megafac F142D, F172, F173, F183 (manufactured by Dainippon Ink and Chemicals, Inc.), Fluorad FC-135, FC-170C, FC-430, FC-431 (manufactured by Sumitomo 3M, Ltd.), Surflon S-112, S-113, S-131, S-141, S-145 (manufactured by Asahi Glass Co., Ltd.), SH-28PA, SH-190, SH-193, SZ-6032, SF-8428 (manufactured by Toray-Dow Corning Silicone Co., Ltd.), and the like can be given.

The amount of these surfactants to be added is preferably not more than 5 wt % for 100 parts by weight of the resin having a hydroxyl group.

Fine patterns can be formed by the following method using the above-mentioned resin composition for forming fine patterns.

(1) Formation of Resist Pattern

A reflection preventing film (organic film or inorganic film) is formed on an 8 or 12 inch silicon wafer substrate by a conventionally known method such as spin coating. Next, a photoresist applied by a conventionally known method such as spin coating is prebaked (PB) at a temperature of about 80 to 140° C. for about 60 to 120 seconds, for example. Then, the resist film is exposed to radiation such as ultraviolet rays (e.g. g-line, i-line, etc.), a KrF excimer laser, an ArF excimer laser, X-rays, electron beams, or the like and subjected to post exposure baking (PEB) at about 80 to 140° C., for example, and developed to form a resist pattern.

(2) Formation of Fine Patterns

The above-mentioned resin composition for forming fine patterns of the present invention is applied to the substrate on which the above resist patterns are formed by a conventionally known method such as spin coating. In certain cases, the solvent may vaporize to form the film coated by spin coating. As required, coated film is prebaked (PB) at a temperature of about 80 to 110° C. for about 60 to 120 seconds, for example, to form a coating film of the resin composition for forming fine patterns.

The substrate on which the resist patterns are coated with the resin composition for forming fine patterns is then treated with heat. An acid produced from the photoresist diffuses from the interface with the photoresist into the layers of the resin composition for forming fine patterns by heat treatment and causes a crosslinking reaction with the resin composition for forming fine patterns to occur. The state of the crosslinking reaction from the interface of the photoresist is determined by the material of resin composition for forming fine patterns, the type of photoresist used, and the baking temperature and time. The temperature and time of heat treatment is usually about 90 to 160° C. for about 60 to 120 seconds.

Next, the coating film of the resin composition for forming fine patterns is developed using an alkaline aqueous solution such as tetramethylammonium hydroxide (TMAH) or the like (for example, about for 60 to 120 seconds) to dissolve the coating film of the non-crosslinked resin composition for forming fine patterns to remove the coating film. Lastly, the substrate is washed with water, whereby hole patterns, ellipse patterns, trench patterns, and the like can be miniaturized.

EXAMPLES

The present invention is described below in more detail by way of examples. However, the present invention is not limited to the following examples. Synthesis Examples of the resin having a hydroxyl group used in Examples will now be described.

Synthesis Example 1

(P-1-1)

(P-1-2)

100 g of p-t-butoxystyrene (P-1-1), 10 g of styrene (P-1-2), and 9.0 g azobisisobutyronitrile were dissolved in propylene glycol monomethyl ether and reacted at 80° C. for 9 hours to polymerize monomers. The polymerization product was purified by precipitation from methanol to obtain 100 g of a p-t-butoxystyrene and styrene copolymer with an Mw of 7,300 and Mw/Mn of 1.80. The copolymer and 50 g of 10 wt % sulfuric acid aqueous solution were dissolved in 300 g of propylene glycol monomethyl ether and hydrolyzed at 90° C. for six hours. The reaction product was purified by precipitation in a large amount of water until the product was neutralized to obtain 65 g of a copolymer of p-hydroxystyrene and styrene (85:15 mol ratio) with an Mw of 5,500 and Mw/Mn of 1.55. This copolymer is indicated as a resin P-1.

Mw and Mn of the resin P-1 and other polymers obtained in the following Synthesis Examples were measured by gel permeation chromatography (GPC) using GPC columns (manufactured by Tosoh Corp., G2000H$_{XL}$×2, G3000H$_{XL}$×1, G4000H$_{XL}$×1) under the following conditions. Flow rate: 1.0 ml/minute, eluate: tetrahydrofuran, column temperature: 40° C., standard reference material: monodispersed polystyrene

Synthesis Example 2

A polymerization reaction was carried out in the same manner as in the Synthesis Example 1 except for changing the amount of styrene to 20 g and the amount of azobisisobutyronitrile to 10 g to obtain 70 g of a copolymer of p-hydroxystyrene and styrene (75:25 mol ratio) with an Mw of 5,200 and Mw/Mn of 1.51. This copolymer is indicated as a resin P-2.

Synthesis Example 3

(P-3-1)

(P-3-2)

The polymerization was carried out in the same manner as in Synthesis Example 1, except for using 20 g of p-methoxystyrene (P-3-2) instead of styrene, followed by hydrolysis with an acid to obtain 78 g of a copolymer of p-hydroxystyrene and p-methoxystyrene (80:20 mol ratio) with an Mw of 5,900 and Mw/Mn of 1.58. This copolymer is indicated as a resin P-3.

Commercially Available Product Example 1

Commercially available polyvinyl alcohol with an average polymerization degree of 900 to 1,100 and a saponification degree of 96% or higher was used. This copolymer is indicated as a resin P-5.

Synthesis Example 4

(P-6-1)

-continued (P-6-2)

58.5 g of vinylpyrrolidone (P-6-1), 70.5 g of acrylic acid (P-6-2), and 9.0 g azobisisobutyronitrile were dissolved in propylene glycol monomethyl ether and reacted at 80° C. for 9 hours to polymerize monomers. The polymerization product was purified by precipitation from hexane to obtain 110 g of a poly(acrylic acid/vinylpyrrolidone) copolymer with an Mw of 5,600 and Mw/Mn of 1.62. This copolymer is indicated as a resin P-6.

Synthesis Example 5

(P-7-1)

(P-7-2)

90 g of p-hydroxymethacrylanilide (P-7-1), 30 g of t-butyl methacrylate (P-7-2), 9 g of azobisisobutyronitrile, and 5 g of 2,4-diphenyl-4-methyl-1-pentene were dissolved in methanol and reacted under refluxing conditions (63° C.) for 8 hours to polymerize monomers. The polymerization product was purified by precipitation from a mixture of methanol and water and a mixture of isopropyl alcohol and heptane to obtain 120 g of a copolymer of p-hydroxymethacrylanilide and t-butyl methacrylate (70:30 mol ratio) with an Mw of 8,500 and Mw/Mn of 2.08. This copolymer is indicated as a resin P-7.

Synthesis Example 6

(P-8-1)

-continued (P-8-2)

The polymerization was carried out in the same manner as Synthesis Example 5, except for using p-hydroxymethacrylanilide (P-8-1) and styrene (P-8-2) as starting materials to obtain a copolymer of p-hydroxymethacrylanilide and styrene (70:30 mol ratio) with an Mw of 5,200 and Mw/Mn of 1.62. This copolymer is indicated as a resin P-8.

Synthesis Example 7

(P-9-1)

(P-9-2)

The polymerization was carried out in the same manner as Synthesis Example 5, except for using p-hydroxymethacrylanilide (P-9-1) and p-t-butoxystyrene (P-9-2) as starting materials to obtain a copolymer of p-hydroxymethacrylanilide and p-t-butoxysyrene (70:30 mol ratio) with an Mw of 7,000 and Mw/Mn of 1.77. This copolymer is indicated as a resin P-9.

Synthesis Example 8

(P-10-1)

-continued (P-10-2)

The polymerization was carried out in the same manner as Synthesis Example 5, except for using p-hydroxymethacrylanilide (P-10-1) and 4,4,4-trifluoro-3-hydroxy-1-methyl-3-trifluoromethyl-1-butyl methacrylate (P-10-2) as starting materials to obtain a copolymer of p-hydroxymethacrylanilide and 4,4,4-trifluoro-3-hydroxy-1-methyl-3-trifluoromethyl-1-butyl methacrylate (85:15 mol ratio) with an Mw of 9,700 and Mw/Mn of 1.99. This copolymer is indicated as a resin P-10.

Synthesis Example 9

The polymerization was carried out in the same manner as Synthesis Example 5, except for using p-hydroxymethacrylanilide (P-11-1) and 3-tricyclo[4.3.0.1$^{2,5}$]decane methacrylate (P-11-2) as starting materials to obtain a copolymer of p-hydroxymethacrylanilide and 3-tricyclo[4.3.0.1$^{2,5}$]decane methacrylate (70:30 mol ratio) with an Mw of 8,000 and Mw/Mn of 1.80. This copolymer is indicated as a resin P-11.

Examples 1-23 and Comparative Examples 1-3

The resin compositions for forming fine patterns were obtained by adding the resins containing a hydroxyl group, crosslinking components, alcoholic solvents, and other additives at proportions shown in Table 1, stirring the mixtures using stirring blades for three hours (at 100 rpm), filtering the reaction mixture through a filter with a pore diameter of 100 nm.

The following crosslinking components and alcoholic solvents were used in the Examples and Comparative Examples.

Crosslinking Components

C-1: Cymel 300 (trade name, manufactured by Nihon Cytec Industries, Inc.)

C-2: Cymel 325 (trade name, manufactured by Nihon Cytec Industries, Inc.)

C-3: Dipentaerythritol hexakis(3-ethyl-3-oxetanylmethyl) ether

C-4: Nikalac MX-750 (trade name, manufactured by Sanwa Chemical Co., Ltd.)

Alcoholic Solvents and Other Components

S-1: 1-butanol
S-2: 4-methyl-2-pentanol
S-3: 1-hexanol
S-4: water
A-1: t-butyl-1-pyrrolidine carboxylate
A-2: tributylamine In order to evaluate the resulting resin compositions for forming fine patterns, substrates for evaluation with resist patterns were prepared by the following methods.

After forming a coating with a thickness of 77 nm (after prebaking at 205° C. for 60 seconds) using an underlayer reflection preventing film ARC29A (manufactured by Brewer Science, Inc.) on an 8-inch silicon wafer by spin coating using Clean Track Act 8 (Tokyo Electron, Ltd.), patterns were produced using JSR ArF AR1244J (an alicyclic radiation sensitive resin composition manufactured by JSR, Corp.). After coating AR1244J by spin coating using Clean Track Act 8 and prebaking (130° C., 90 sec) to produce a film with a thickness of 210 nm, the film was exposed (dose: 30 mJ/cm$^2$) using an ArF projection exposure device S306C (manufactured by Nikon Corp.) under optical conditions of NA: 0.78, sigma: 0.85, and ⅔ Ann, subjected to PEB (130° C., 90 sec) using Clean Track Act 8 hot plate, subjected to puddle development using an LD nozzle of the Clean Track Act 8 (60 sec), rinsed with ultrapure water, and spin-dried by swinging at 4,000 rpm for 15 seconds to obtain a substrate for evaluation. The substrate obtained in this process is indicated as a substrate A for evaluation. A number of substrates A for evaluation were prepared under the same conditions.

Using the resulting substrates for evaluation, patterns corresponding to a mask pattern with a hole diameter of 100 nm and a line space of 100 nm (bias: +30 nm, i.e. hole diameter of 130 nm and line space of 70 nm on the mask) were inspected to measure the resist pattern hole diameter using a scanning electron microscope ("S-9360" manufactured by Hitachi High-Tech Fielding Corp.).

The substrates for evaluation with resist patterns coated with the resin compositions for forming fine patterns in Examples shown in Table 1 were evaluated as follows. The evaluation results are shown in Table 2.

(1) Embedding Property Evaluation

A coating film with a thickness of 300 nm was obtained on the above-mentioned substrate A for evaluation by spin coating the resin compositions for forming fine patterns shown in Table 1 using Clean Track Act 8 and baking (100° C., 90 seconds). Then, 20 points on a cross-section of a 100 nm diameter pattern area were inspected using a scanning electron microscope ("S-4800" manufactured by Hitachi High-Tech Fielding Corp.). Embedding properties were regarded as "Good" if there were no voids such as air bubbles in the pattern, and as "Bad" if voids were observed. In Examples 8 to 23, the films were prepared only by spin coating without baking.

(2) Shrink Rate Evaluation

A coating film with a thickness of 300 nm obtained by applying the resin compositions for forming fine patterns shown in Table 1 to the above-mentioned substrate A for evaluation by spin coating using Clean Track Act 8 and baking at 100° C. for 90 seconds was baked under the conditions for the shrink rate evaluation shown in Table 1 in order to cause the resist pattern to react with the resin composition. The substrate was then subjected to paddle development for 60 seconds using a 2.38 wt % of TMAH aqueous solution as a developer jetted from the LD nozzle of the Clean Track Act 8, rinsed with ultrapure water, and spin-dried by swinging at 4,000 rpm for 15 seconds. The substrate obtained in this process is indicated as a substrate B for evaluation. In Examples 8 to 23, the films were prepared only by spin coating without baking.

In Comparative Examples 1 to 3, the substrate was subjected to paddle development using ultrapure water as a developer jetted from LD nozzles of the Clean Track Act 8 for 60 seconds and spin-dried by swinging at 4,000 rpm for 15 seconds.

For the shrink rate evaluation of pattern dimension, patterns corresponding to a mask pattern with a hole diameter of 100 nm and a line space of 100 nm (bias: +30 nm, i.e. hole diameter of 130 nm and line space of 70 nm on the mask) were inspected to measure the resist pattern hole diameter using a scanning electron microscope ("S-9360" manufactured by Hitachi High-Tech Fielding Corp.). The shrink rate was calculated using the following formula.

$$\text{Shrink rate}(\%)=[(\phi 1-\phi 2)/\phi 1]\times 100$$

φ1: Diameter of resist pattern holes of the substrate A for evaluation (nm)

φ2: Diameter of resist pattern holes of the substrate B for evaluation (nm)

Substrates in which shrinkage was confirmed were evaluated as "Good" and those in which shrinkage was not confirmed or patterns were destroyed were evaluated as "Bad". The results of evaluation of Comparative Examples 1 to 3 are indicated by asterisks in Table 2, because the evaluation was impossible due to non-uniform embedding conditions and shrink rate fluctuation. Patterns corresponding to a mask pattern with a hole diameter of 100 nm and a line space of 560 nm (bias: +40 nm, i.e. hole diameter of 140 nm and line space of 520 nm on the mask) were also inspected in the same manner as above using the substrate B for evaluation in Examples 9, 12, 13, and 21 in order to evaluate pitch dependability. Pitch dependability was small in substrates of Examples 9, 12, 13, and 21.

(3) Residue Evaluation

Cross-sections of patterns of the substrate B for evaluation corresponding to a mask pattern with a hole diameter of 100 nm and a line space of 100 nm (bias: +30 nm, i.e. hole diameter of 130 nm and line space of 70 nm on the mask) were inspected using a scanning electron microscope ("S-4800" manufactured by Hitachi High-Tech Fielding Corp.). The substrate was evaluated as "Good" when no residue was observed on the bottom of the opening, and otherwise as "Bad".

(4) Evaluation of Shape After Pattern Shrinkage

Figure 1:
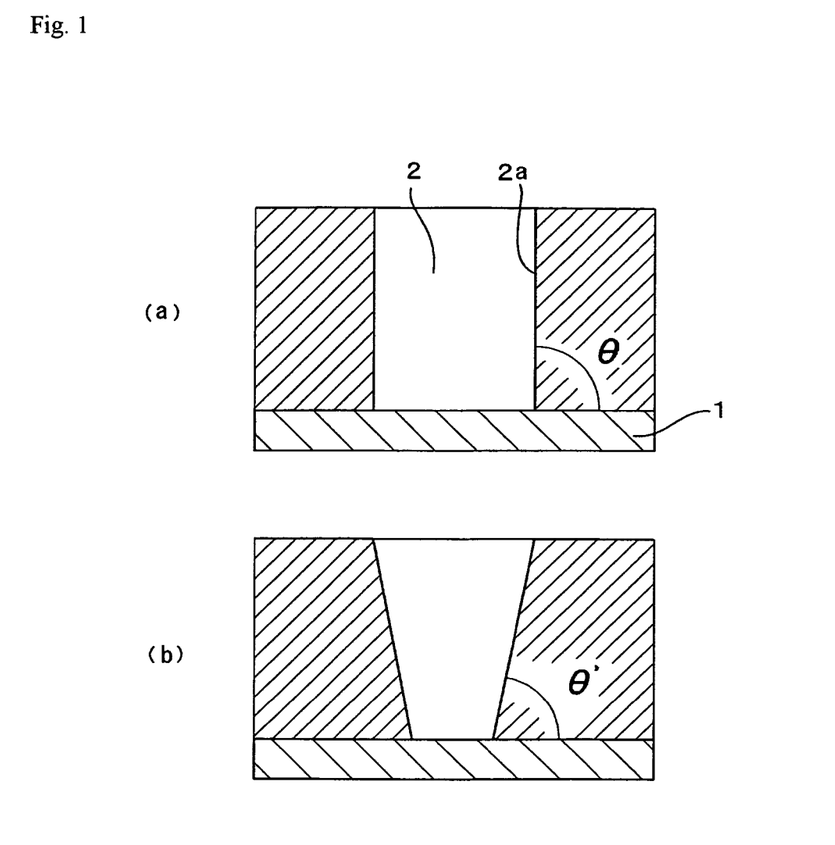
FIG. 1: Cross-section of a hole pattern
Figure 2:
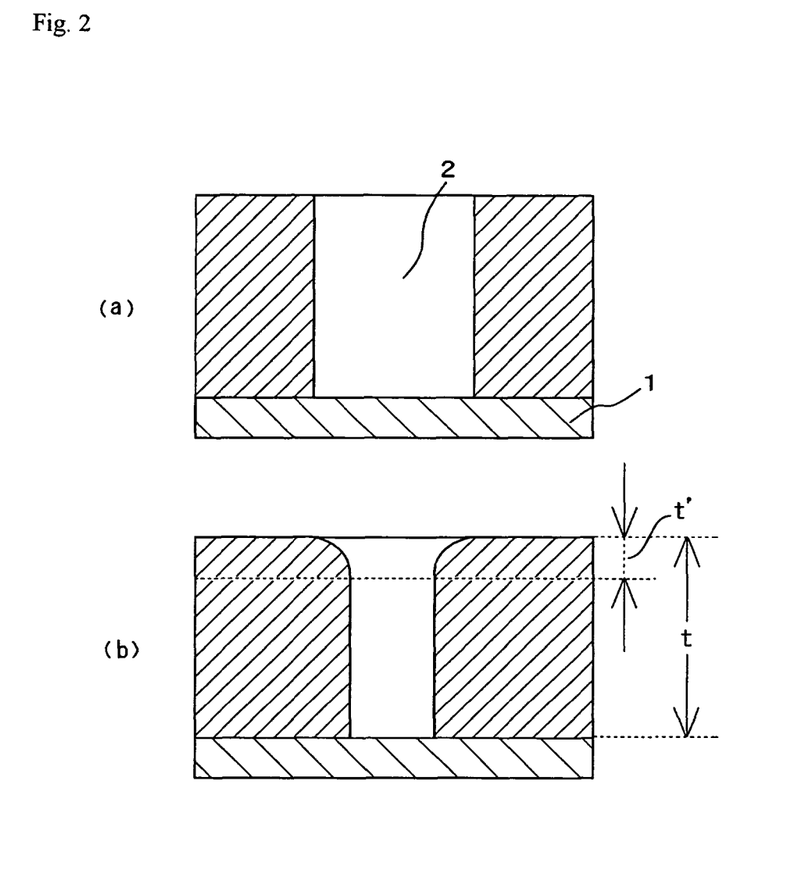
FIG. 2: Cross-section of a hole pattern

In the substrate A and substrate B for evaluation, cross-sections of patterns corresponding to a mask pattern with a hole diameter of 100 nm and a line space of 100 nm (bias: +30 nm, i.e. hole diameter of 130 nm and line space of 70 nm on the mask) and being existing in the corresponding positions were inspected using a scanning electron microscope ("S4800" manufactured by Hitachi High-Tech Fielding Corp.). The shapes of the cross-section are shown in FIG. 1 and FIG. 2. The pattern shrinkage was evaluated to be "Good" when the difference of the angle of the side wall 2 of the hole pattern 2 to the substrate 1 before the pattern shrinkage (θ) (see FIG. 1(a)) and after the pattern shrinkage (θ') (see FIG. 1(b)) is not more than 3° (see FIG. 1) and when pattern deterioration t' is seen on the pattern on the substrate B for evaluation only for parts from the substrate 1 exceeding 80 (see FIG. 2(b)), provided that the resist film thickness t in the substrate A for evaluation (see FIG. 2(a)) is regarded as 100, and otherwise evaluated to be "Bad" (see FIG. 2). The results of evaluation of Comparative Examples 1 to 3 are indicated by asterisks in Table 2, because the evaluation was impossible due to non-uniform embedding conditions and a great shrink rate fluctuation.

(5) Evaluation of Pattern Defects

The pattern defect evaluation was carried out using the products prepared in Examples 9, 12, 13, and 21 and Comparative Example 3. Pattern defects were measured after forming a pattern in the photoresist. After applying the resin composition for forming fine patterns, followed by baking and developing, the defects were measured again using a defect measuring instrument ("Wafer defect inspection instrument 2351" with a UV clear vision field pattern, manufactured by KLA Tencor) under the same conditions. In the measurement, a pattern of 150 nm hole/300 nm pitch was formed on an 8 inch wafer and defects in a measuring area of 37.590 $cm^2$ were measured. Defects of which the coordinates before and after pattern miniaturization remain the same and defects of which the coordinates before and after pattern miniaturization are not the same were measured. The results were rated as "Good", if the total number of these defects was not more than 40, and as "Bad", if more than 40.

(6) Evaluation of Etching Resistance

The substrate B for evaluation was dry-etched using a dry-etching apparatus ("Pinnacle 8000" manufactured by PMT, Inc.) using $CF_4$ as etching gas under the conditions of a gas flow rate of 75 sccm, a pressure of 2.5 mTorr, and an output of 2,500 W to mainly inspect cross-sections of hole patterns and roughness of the hole pattern peripheral by cross-section SEM. As the evaluation criteria, the case in which microscopic pits on the section and the surface were distinctly observed was rated as "Bad", and the case in which the number of microscopic pits was comparatively small was rated as "Good".

(7) Baking Temperature Dependability

Products prepared in Examples 9, 12, 13, and 21 were evaluated in the same manner as in the above-mentioned shrink rate evaluation, provided that the temperature range was the range of the baking temperature dependability evaluation test shown in Table 1, to measure the baking temperature dependability (%/° C.) of the shrink rate. The evaluation results are shown in Table 2.

TABLE 1

| | Resin | | Crosslinking component | | Solvent-1 | | Solvent-2 | | Additive | | Baking conditions of shrink rate evaluation | Temperature range pf baking temperature dependability evaluation |
|---|---|---|---|---|---|---|---|---|---|---|---|---|
| Example | | | | | | | | | | | | |
| 1 | P-1 | 10.0 g | C-1 | 3.0 g | S-1 | 100 g | — | | — | | 145° C., 90 sec | — |
| 2 | P-1 | 10.0 g | C-1 | 3.0 g | S-2 | 100 g | — | | — | | 145° C., 90 sec | — |

TABLE 1-continued

| | | Resin | | Crosslinking component | | Solvent-1 | | Solvent-2 | | Additive | | Baking conditions of shrink rate evaluation | Temperature range pf baking temperature dependability evaluation |
|---|---|---|---|---|---|---|---|---|---|---|---|---|---|
| 3 | | P-1 | 10.0 g | C-1 | 3.0 g | S-3 | 100 g | — | | — | | 145° C., 90 sec | — |
| 4 | | P-1 | 10.0 g | C-2 | 3.0 g | S-1 | 100 g | — | | — | | 145° C., 90 sec | — |
| 5 | | P-1 | 10.0 g | C-3 | 3.0 g | S-1 | 100 g | — | | — | | 145° C., 90 sec | — |
| 6 | | P-2 | 10.0 g | C-2 | 3.0 g | S-1 | 100 g | — | | — | | 145° C., 90 sec | — |
| 7 | | P-3 | 10.0 g | C-2 | 3.0 g | S-1 | 100 g | — | | — | | 145° C., 90 sec | — |
| 8 | | P-7 | 10.0 g | C-4 | 3.0 g | S-1 | 180 g | — | | — | | 140° C., 90 sec | — |
| 9 | | P-7 | 10.0 g | C-4 | 3.0 g | S-1 | 180 g | — | | — | | 160° C., 90 sec | 150° C.-160° C. |
| 10 | | P-7 | 10.0 g | C-4 | 3.0 g | S-1 | 180 g | — | | — | | 160° C., 90 sec | — |
| 11 | | P-8 | 10.0 g | C-2 | 3.0 g | S-1 | 180 g | — | | — | | 160° C., 90 sec | — |
| 12 | | P-8 | 10.0 g | C-4 | 3.0 g | S-1 | 180 g | — | | — | | 160° C., 90 sec | 150° C.-160° C. |
| 13 | | P-9 | 10.0 g | C-4 | 3.0 g | S-1 | 180 g | — | | — | | 155° C., 90 sec | 145° C.-155° C. |
| 14 | | P-10 | 10.0 g | C-4 | 3.0 g | S-1 | 180 g | — | | — | | 160° C., 90 sec | — |
| 15 | | P-11 | 10.0 g | C-4 | 3.0 g | S-1 | 180 g | — | | — | | 160° C., 90 sec | — |
| 16 | | P-7 | 10.0 g | C-4 | 3.0 g | S-2 | 180 g | — | | — | | 160° C., 90 sec | — |
| 17 | | P-8 | 10.0 g | C-4 | 3.0 g | S-2 | 180 g | — | | — | | 160° C., 90 sec | — |
| 18 | | P-9 | 10.0 g | C-4 | 3.0 g | S-2 | 180 g | — | | — | | 155° C., 90 sec | — |
| 19 | | P-10 | 10.0 g | C-4 | 3.0 g | S-2 | 180 g | — | | — | | 160° C., 90 sec | — |
| 20 | | P-9 | 10.0 g | C-4 | 3.0 g | S-1 | 180 g | — | | A-1 | 0.05 g | 160° C., 90 sec | — |
| 21 | | P-9 | 10.0 g | C-4 | 3.0 g | S-1 | 174 g | S-4 | 6 g | — | | 155° C., 90 sec | 145° C.-155° C. |
| 22 | | P-9 | 10.0 g | C-4 | 3.0 g | S-1 | 174 g | S-4 | 6 g | A-1 | 0.05 g | 160° C., 90 sec | — |
| 23 | | P-9 | 10.0 g | C-4 | 3.0 g | S-1 | 174 g | S-4 | 6 g | A-2 | 0.05 g | 160° C., 90 sec | — |
| Comparative Example | | | | | | | | | | | | | |
| 1 | | P-5 | 10.0 g | C-1 | 3.0 g | S-4 | 100 g | — | | — | | 145° C., 90 sec | — |
| 2 | | P-5 | 10.0 g | — | | S-4 | 100 g | — | | — | | 145° C., 90 sec | — |
| 3 | | P-6 | 10.0 g | — | | S-4 | 100 g | — | | — | | 145° C., 90 sec | — |

TABLE 2

| | Embedding Property | Shrink rate (100 nm hole/ 100 nm space) | Shrink rate (100 nm hole/ 560 nm space) | Residue | Etching resistance | Shape after pattern shrinkage | Baking temperature dependability | | Evaluation of pattern defects |
|---|---|---|---|---|---|---|---|---|---|
| | | | | | | | 100 nm hole/ 100 nm space | 100 nm hole/ 560 nm space | |
| Example | | | | | | | | | |
| 1 | Good | Good: 9.2% | — | Good | Good | Good | — | — | — |
| 2 | Good | Good: 9.2% | — | Good | Good | Good | — | — | — |
| 3 | Good | Good: 9.2% | — | Good | Good | Good | — | — | — |
| 4 | Good | Good: 9.2% | — | Good | Good | Good | — | — | — |
| 5 | Good | Good: 9.2% | — | Good | Good | Good | — | — | — |
| 6 | Good | Good: 9.2% | — | Good | Good | Good | — | — | — |
| 7 | Good | Good: 9.2% | — | Good | Good | Good | — | — | — |
| 8 | Good | Good: 13.2% | — | Good | Good | Good | — | — | — |
| 9 | Good | Good: 21.2% | Good: 21.5% | Good | Good | Good | 0.81 | 0.72 | Good |
| 10 | Good | Good: 19.2% | — | Good | Good | Good | — | — | — |
| 11 | Good | Good: 25.4% | — | Good | Good | Good | — | — | — |
| 12 | Good | Good: 25.6% | Good: 24.9% | Good | Good | Good | 0.93 | 0.95 | Good |
| 13 | Good | Good: 21.2% | Good: 21.3% | Good | Good | Good | 0.81 | 0.77 | — |
| 14 | Good | Good: 21.5% | — | Good | Good | Good | — | — | — |
| 15 | Good | Good: 21.7% | — | Good | Good | Good | — | — | — |
| 16 | Good | Good: 21.1% | — | Good | Good | Good | — | — | — |
| 17 | Good | Good: 25.5% | — | Good | Good | Good | — | — | — |
| 18 | Good | Good: 21.6% | — | Good | Good | Good | — | — | — |
| 19 | Good | Good: 21.7% | — | Good | Good | Good | — | — | Good |
| 20 | Good | Good: 21.6% | — | Good | Good | Good | — | — | Good |
| 21 | Good | Good: 21.1% | Good: 21.5% | Good | Good | Good | 0.82 | 0.92 | Good |
| 22 | Good | Good: 21.8% | — | Good | Good | Good | — | — | — |
| 23 | Good | Good: 21.0% | — | Good | Good | Good | — | — | — |
| Comparative Example | | | | | | | | | |
| 1 | Bad | * | — | Bad | Bad | * | — | — | — |
| 2 | Bad | * | — | Bad | Bad | * | — | — | — |
| 3 | Bad | * | — | Good | Bad | * | — | — | Bad |

INDUSTRIAL APPLICABILITY

The resin composition for forming fine patterns of the present invention can effectively and accurately miniaturize resist pattern spaces and can excellently and economically form patterns surpassing a wavelength limit. Therefore, the resin composition can be used very suitably in the field of microfabrication represented by production of integrated circuit elements which are expected to become increasingly miniaturized in the future.

EXPLANATION OF SYMBOLS

1: Substrate
2: Hole pattern

The invention claimed is:

1. A resin composition for forming fine patterns comprising a resin which is not soluble in water, but soluble in alcohol, containing a hydroxyl group, a crosslinking component, and a solvent, capable of miniaturizing a resist pattern formed by a resist material by applying the composition to the resist pattern causing the resist pattern to shrink,
wherein the solvent is a nonaqueous-type solvent which does not contain water and dissolves the resin and the crosslinking component, but cannot dissolve the resist material,
wherein the nonaqueous-type solvent contains an alcohol.

2. The resin composition according to claim 1, wherein the alcohol is a monovalent alcohol having 1 to 8 carbon atoms.

3. The resin composition according to claim 1, wherein the hydroxyl group is at least one hydroxyl group (—OH) selected from hydroxyl groups originating from an alcohol, a phenol, or a carboxylic acid.

4. The resin composition according to claim 3, wherein the hydroxyl group originating from an alcohol is a hydroxyl group having a fluoroalkyl group on a carbon atom of α position.

5. The resin composition according to claim 3, wherein the hydroxyl group originating from a phenol is a phenolic hydroxyl group having an amide bond in the molecule.

6. The resin composition according to claim 1, wherein the resin containing a hydroxyl group is a resin obtainable by copolymerizing at least one compound, selected from hydroxyacrylanilide and hydroxymethacrylanilide.

7. The resin composition according to claim 1, wherein the crosslinking component is at least one compound selected from compounds containing a group shown by the following formula (1) and compounds containing two or more cyclic ethers as a reactive group, (1)

wherein $R^1$ and $R^2$ individually represent a hydrogen atom or a group shown by the following formula (2), provided that at least one of $R^1$ and $R^2$ is the group shown by the following formula (2), (2)

wherein $R^3$ and $R^4$ individually represent a hydrogen atom, an alkyl group having 1 to 6 carbon atoms, or an alkoxyalkyl group having 1 to 6 carbon atoms, or $R^3$ and $R^4$ bond together to form a ring having 2 to 10 carbon atoms, and $R^5$ represents a hydrogen atom or an alkyl group having 1 to 6 carbon atoms.

8. The resin composition according to claim 7, wherein the crosslinking component is a compound containing a group shown by the above formula (1).

9. A method for forming a fine pattern comprising a step of forming a resist pattern on a substrate, a step of forming a coating of the resin composition for forming fine patterns on the resist pattern, a step of treating the coated substrate with heat, and a step of removing the coating with an alkaline aqueous solution and washing the substrate with water, wherein the resin composition for forming fine patterns is the resin composition according to claim 1.

10. A resin composition for forming fine patterns comprising a resin which is not soluble in water, but soluble in alcohol, containing a hydroxyl group, a crosslinking component, and a solvent, capable of miniaturizing a resist pattern formed by a resist material by applying the composition to the resist pattern causing the resist pattern to shrink,
wherein the solvent is an alcohol solvent containing water in an amount of 10 wt % or less for the total solvent, the alcohol solvent consists essentially of one alcohol selected from 1-hexanol, 1-butanol, 2-butanol, and 4-methyl-2-pentanol.

11. The resin composition according to claim 10, wherein the hydroxyl group is at least one hydroxyl group (—OH) selected from hydroxyl groups originating from an alcohol, a phenol, or a carboxylic acid.

12. The resin composition according to claim 11, wherein the hydroxyl group originating from an alcohol is a hydroxyl group having a fluoroalkyl group on a carbon atom of α position.

13. The resin composition according to claim 11, wherein the hydroxyl group originating from a phenol is a phenolic hydroxyl group having an amide bond in the molecule.

14. The resin composition according to claim 10, wherein the resin containing a hydroxyl group is a resin obtainable by copolymerizing at least one compound selected from hydroxyacrylanilide and hydroxymethacrylanilide.

15. The resin composition according to claim 10, wherein the crosslinking component is at least one compound selected from compounds containing a group shown by the following formula (1) and compounds containing two or more cyclic ethers as a reactive group, (1)

wherein $R^1$ and $R^2$ individually represent a hydrogen atom or a group shown by the following formula (2), provided that at least one of $R^1$ and $R^2$ is the group shown by the following formula (2), (2)

wherein $R^3$ and $R^4$ individually represent a hydrogen atom, an alkyl group having 1 to 6 carbon atoms, or an alkoxyalkyl group having 1 to 6 carbon atoms, or $R^3$ and $R^4$ bond together to form a ring having 2 to 10 carbon atoms, and $R^5$ represents a hydrogen atom or an alkyl group having 1 to 6 carbon atoms.

16. The resin composition according to claim 15, wherein the crosslinking component is a compound containing a group shown by the above formula (1).

17. A method for forming a fine pattern comprising a step of forming a resist pattern on a substrate, a step of forming a coating of the resin composition for forming fine patterns on the resist pattern, a step of treating the coated substrate with heat, and a step of removing the coating with an alkaline aqueous solution and washing the substrate with water, wherein the resin composition for forming fine patterns is the resin composition according to claim 10.

* * * * *